United States Patent [19]
Elliott

[11] 4,117,470
[45] Sep. 26, 1978

[54] DATA BIT COMPRESSION SYSTEM
[75] Inventor: Alan E. Elliott, Norwood, Mass.
[73] Assignee: Data General Corporation, Westboro, Mass.
[21] Appl. No.: 731,034
[22] Filed: Oct. 8, 1976
[51] Int. Cl.² .............................................. G06F 3/14
[52] U.S. Cl. ...................... 340/324 AD; 340/347 DD
[58] Field of Search ................ 340/347 DD, 324 AD; 178/69 R

[56] References Cited
U.S. PATENT DOCUMENTS

| | | | |
|---|---|---|---|
| 3,653,028 | 3/1972 | Cuccio | 340/324 AD |
| 3,863,284 | 1/1975 | Deschenes et al. | 340/347 DD |
| 3,875,344 | 4/1975 | Bogart | 340/347 DD |
| 4,006,304 | 2/1977 | Sell | 340/347 DD |

Primary Examiner—Marshall M. Curtis
Attorney, Agent, or Firm—Robert F. O'Connell

[57] ABSTRACT

A binary data signal compression system which includes means responsive to a first selected group of bits of the binary data signal, which is less than the total number of bits of the binary data signal, for producing a second selected group of bits which is less than the first selected group of bits but which contains information corresponding thereto. The second selected group of bits and the remaining bits of the binary data signal are hereupon combined to provide the desired compressed binary data signal.

7 Claims, 6 Drawing Figures

| R4 | R3 | C6 | C5 | C4 |   | O4 | O3 | O2 | O1 |
|---|---|---|---|---|---|---|---|---|---|
| 0 | 0 | 0 | 0 | 0 |   | 0 | 0 | 0 | 0 |
| 0 | 0 | 0 | 0 | 1 |   | 0 | 0 | 0 | 1 |
| 0 | 0 | 0 | 1 | 0 |   | 0 | 0 | 1 | 0 |
| 0 | 0 | 0 | 1 | 1 |   | 0 | 0 | 1 | 1 |
| 0 | 0 | 1 | 0 | 0 |   | 1 | 1 | 0 | 0 |
| 0 | 1 | 0 | 0 | 0 |   | 0 | 1 | 0 | 0 |
| 0 | 1 | 0 | 0 | 1 |   | 0 | 1 | 0 | 1 |
| 0 | 1 | 0 | 1 | 0 |   | 0 | 1 | 1 | 0 |
| 0 | 1 | 0 | 1 | 1 |   | 0 | 1 | 1 | 1 |
| 0 | 1 | 1 | 0 | 0 |   | 1 | 1 | 0 | 1 |
| 1 | 0 | 0 | 0 | 0 |   | 1 | 0 | 0 | 0 |
| 1 | 0 | 0 | 0 | 1 |   | 1 | 0 | 0 | 1 |
| 1 | 0 | 0 | 1 | 0 |   | 1 | 0 | 1 | 0 |
| 1 | 0 | 0 | 1 | 1 |   | 1 | 0 | 1 | 1 |
| 1 | 0 | 1 | 0 | 0 |   | 1 | 1 | 1 | 0 |

FIG.3

| A6 | A5 | S3 | S2 | S1 | | O4 | O3 | O2 | O1 |
|----|----|----|----|----|---|----|----|----|----|
| 0 | 1 | 0 | 0 | 0 | | 0 | 1 | 0 | 0 |
| 0 | 1 | 0 | 0 | 1 | | 0 | 1 | 0 | 1 |
| 0 | 1 | 0 | 1 | 0 | | 0 | 1 | 1 | 0 |
| 0 | 1 | 0 | 1 | 0 | | 0 | 1 | 1 | 1 |
| 0 | 1 | 1 | 0 | 0 | | 0 | 0 | 0 | 1 |
| 1 | 0 | 0 | 0 | 0 | | 1 | 0 | 0 | 0 |
| 1 | 0 | 0 | 0 | 1 | | 1 | 0 | 0 | 1 |
| 1 | 0 | 0 | 1 | 0 | | 1 | 0 | 1 | 0 |
| 1 | 0 | 0 | 1 | 1 | | 1 | 0 | 1 | 1 |
| 1 | 0 | 1 | 0 | 0 | | 0 | 0 | 1 | 0 |
| 1 | 1 | 0 | 0 | 0 | | 1 | 1 | 0 | 0 |
| 1 | 1 | 0 | 0 | 1 | | 1 | 1 | 0 | 1 |
| 1 | 1 | 0 | 1 | 0 | | 1 | 1 | 1 | 0 |
| 1 | 1 | 0 | 1 | 1 | | 1 | 1 | 1 | 1 |
| 1 | 1 | 0 | 0 | 0 | | 0 | 0 | 1 | 1 |

FIG.5

DATA BIT COMPRESSION SYSTEM

INTRODUCTION

This invention relates generally to the handling of binary data bit information in a data processing system and more particularly to the reduction of the number of data bits in a binary data signal without the loss of data information therein.

BACKGROUND OF THE INVENTION

In data processing systems as, for example, digital computer systems which handle binary data information, the data and control information used therein is contained in data words which normally comprise a fixed number of binary data bits. Preferably, in most computer systems such data words are comprised of data bits combined in multiples of four, i.e., data and control words using 4 bits, 8 bits, 12 bits, 16 bits, etc.

Often such data words are utilized with peripheral and terminal equipment associated with the data processing system which is configured, for example, for human control and interaction and frequently has value generating elements which do not necessarily require the same modulus (i.e., the same total number of data bits) as that used by the data processing system. Such lack of correspondence between the number of data bits utilized in the data words of the data processing system and the number of data bits utilized for generating the desired information in the associated equipment results in an inefficient use of the system components and/or the requirement for additional circuitry which duplicates the value generating elements and operates in parallel with them but on a modulus which is more consistent with other system requirements. Such conventional methods for dealing with a lack of correspondence between the data processing system and the associated equipment often tend to increase the cost, complexity and power consumption of the overall system while at the same time decreasing the reliability thereof and occasionally introducing a failure mode from which the device is unable to recover.

It is desirable, therefore, to devise a system for permitting an optimum utilization of existing system components so as to reduce the inefficiencies, costs and complexities involved in such lack of correspondence, which system would be integral with the overall data processing apparatus and not require redundant components.

In a specific application, for example, such a system can provide optimum utilization of addressable memory elements where the address word is composed of more than one sub-word, for example, and each of such sub-words do not require all possible combinations of its binary bits in order to convey all of the data information needed. If the sum of the bits of the sub-words is more than the number of bits necessary to address an addressable memory element, for example, the system of the invention can provide an appropriate compression of the sub-word data information so as to produce an address word which has fewer bits than the total number of bits in the sub-words.

BRIEF SUMMARY OF THE INVENTION

In accordance with the invention, if a first binary data signal has a first number of data bits, all possible combinations of which are not required in order to convey data information, such binary data signal can be appropriately operated on to provide a second binary data signal which has fewer data bits than the original signal. The invention includes means which is responsive to a first selected group of data bits of a first binary signal for producing a second selected group of data bits the number of which is less than in the first selected group and the data information in the second selected group is then appropriately combined with the remaining group of data bits of the binary data signal which was not included in the first selected group thereof. Such combination thereby provides a second binary data signal which has fewer data bits than the first binary data signal.

DESCRIPTION OF THE INVENTION

The invention can be understood in more detail in a specific application thereof in accordance with the description given below with the assistance of the accompanying drawing wherein FIG. 1 shows a broad block diagram of one embodiment of the system of the invention for use in an exemplary cathode ray tube terminal;

FIG. 3 shows a chart depicting the correspondence between data bit information at the input and the output of the portion of the invention depicted in FIG. 2;

FIG. 5 shows a chart depicting the correspondence between data bit information and the input and the output of a portion of the invention as used with such dot matrix coding system.

Figure 1:
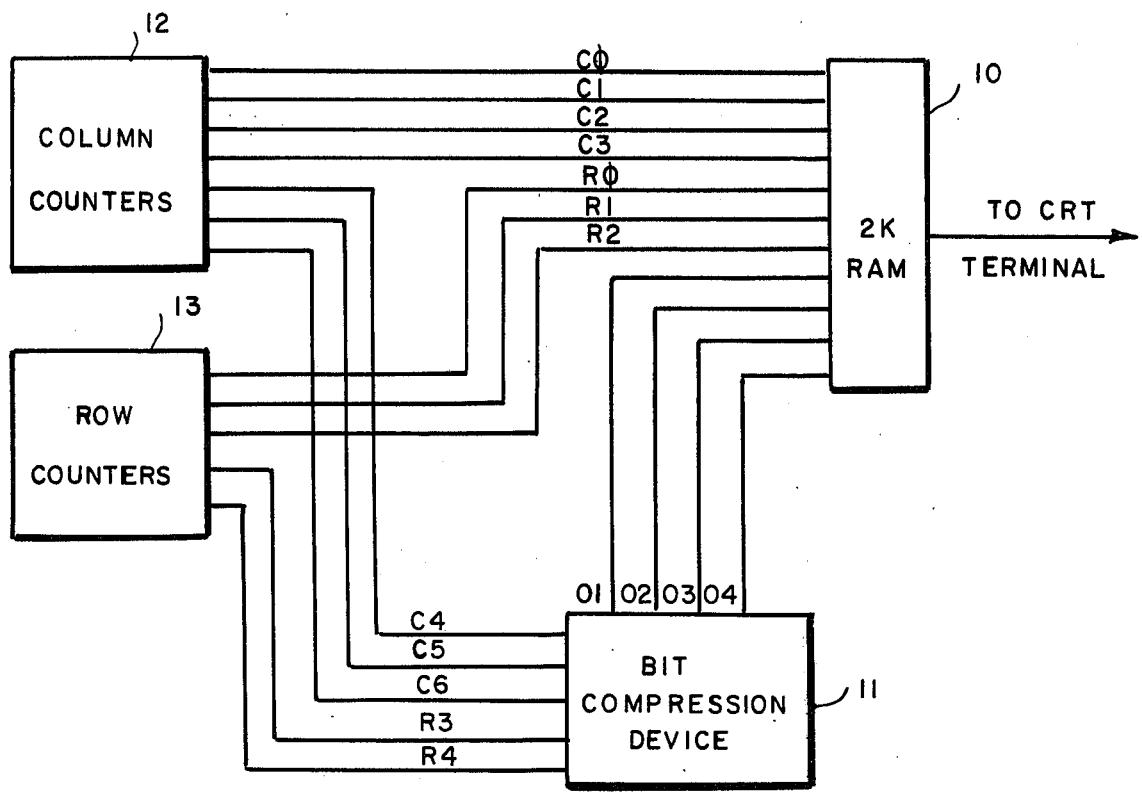

While the invention is not to be construed as limited thereto, an understanding thereof can be readily obtained by describing the invention as it might be used with reference to a data processing system using a cathode ray tube (CRT) display terminal which utilizes a suitable memory for refresh, where no intelligence (e.g. no processor unit) is available in the display terminal. A common implementation for providing column and row address words as used in prior art systems utilizes a shift register memory. For a memory size equal to that of a 2K RAM (i.e., a random access memory having a storage capacity of 2048 words), such a shift register must be 2K words long and must have its output connected back to its input through a multiplexer.

The shift register is clocked continuously at a clock rate such that it performs one revolution plus 80 counts in less than one text line of video information, which operation typically takes about 600 microseconds (μsec.). Addressing of the memory is performed by an external counter which is incremented with each shift of the memory. Thus, the address of the memory input/output (I/O) port is a function of time and at any given time only the address indicated by the address counter is available. While the memory address counter is physically independent of, and external to, the memory, it can be configured to the moduli required by the rest of the system. A disadvantage of such a configuration is that the shift registers are continually clocked at a relatively high frequency (e.g. about 4 MHz) so that they dissipate relatively high power (e.g. about 1 watt/2K bits and, hence, are less reliable than the RAMs.

Further, because memory locations are only available in sequence, the worst-case, access time of a given location is about 600 μsec., with an average access time of 300 μsec., it being desirable to reduce considerably such access time to provide much lower access times.

Moreover, because the memory address counter is only related to memory locations in time, any timing fault that affects one, but not the other, results in a disorientation of memory from which the system cannot recover without clearing the entire memory.

The system of the invention overcomes the above disadvantages by utilizing a random access memory (RAM) for supplying column and row addresses to a cathode ray tube terminal which has a capacity, for example, for displaying 24 lines of 80 characters each, such a system requiring a total refresh memory requirement of 1920 characters. The random access memory therefor in its optimum form will be a memory device which can store all of said 1920 characters. Such optimum memory device is a 2K RAM which, as mentioned above, it is capable of storing up to 2048 data bits.

Such a system is more reliable than one which utilizes a continuously clocked register having high power dissipation and provides average access times of as low as 1 μsec. or less. With the use of a RAM, addressing is direct and absolute and faults are, therefore, recoverable without having to clear the entire memory. In accordance therewith, a data processing system which supplies data information for such display to the terminal utilizes appropriate memory address generating elements which identify the column and row of a particular desired character. Such memory address generating elements are, for example, appropriate video timing counters and appropriate cursor address counters, each of which provide column and row information. Since there are 80 columns which can be displayed on the cathode ray tube, the counters include column elements which have a modulus of 80 and, therefore, require 7 binary bits. Since the cathode ray tube can display 24 rows, the counters include row elements having a modulus of 24 and, therefore, require five binary bits. The total number of binary bits for identifying column and row address, therefore, in an appropriate address word requires 12 data bits.

However, as discussed above, the cathode ray tube terminal only requires a random access memory having a 2K capacity and such RAM needs only eleven address input bits. For optimum operation of the data processing system with the cathode ray tube terminal, therefore, it is desirable that the twelve bit address word from the video timing counters and cursor address counters be compressed into an 11 bit address word for the RAM.

If the column counters provide a 7 bit sub-word which can be identified as comprising bits C6, C5, C4, C3, C2, C1, and Cφ (in order of most significant bit down to least significant bit) and the row counters supply a five bit word identified as comprising bits R4, R3, R2, R1 and Rφ (from most significant bit to least significant bit), the system of the invention can be described broadly in the block diagram of FIG. 1. As can be seen therein, the four least significant bits of the column counter sub-word and the three least significant bits of the row counter sub-word are supplied directly as address bits in the input address word to a 2K random access memory 10. The three most significant bits of the column sub-word and the two most significant bits of the row sub-word are supplied to a bit compression device 11 which converts the address information therein into a 4 bit word which contains the same address information. The latter 4 bit word, identified as comprising address bits 01, 02, 03 and 04, is thereby combined with the least significant bits of each of the column and row sub-words to produce an 11 bit address word for the 2K RAM.

Figure 2:
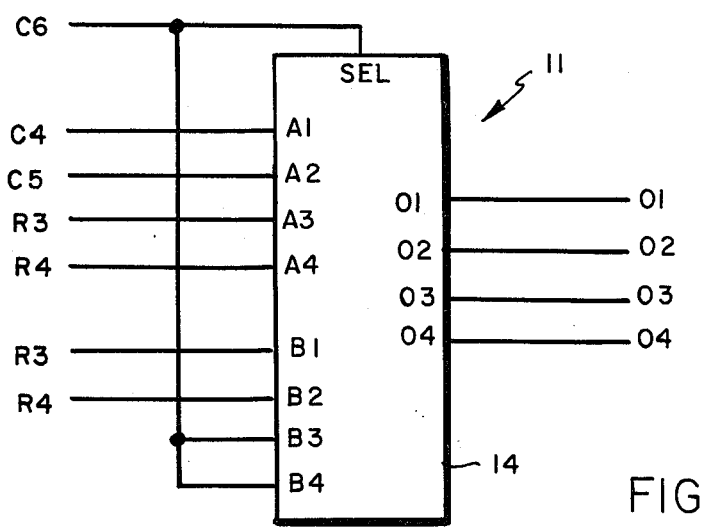
FIG. 2 shows a more detailed block diagram of a portion of the system shown in FIG. 1.

Operation of the bit compression device is described below with reference to the address bit information contained in the sub-words and a specific embodiment thereof is described in more detail with reference to FIG. 2. In order to understand the operation of the system of the invention it is helpful to discuss the content of the sub-words and the information they contain. The range of allowable values for the seven bit column sub-word (C6 . . . Cφ) includes 80 different combinations thereof from sub-word 0000000 to sub-word 1001111. The range of allowable values for the 5 bit row counter sub-word (R4 . . . Rφ) includes 24 combinations thereof from sub-word 00000 to sub-word 10111.

Thus, the three most significant bits of the column sub-word (C6, C5, C4) require only five different allowable states (000, 001, 010, 011 and 100). For each of these five allowable states the four lower order bits (C3, C2, C1, Cφ) can assume any of 16 possible values. The two most significant bits of the row sub-word (R4, R3) have three allowable states 00, 01 and 10). For each of these three allowable states the three lower order bits (R2, R1, Rφ) can assume any of eight possible values.

Accordingly, the lower order bits from each of the sub-words can be supplied directly to the 2K RAM 10 in FIG. 1 as shown by the direct connection of bits C3, C2, C1 and Cφ of the column word and bits R2, R1 of the row word to the random access memory. Since the remaining 5 bits, namely the three most significant bits of the column sub-word and the two most significant bits of the row sub-word, do not assume all of the combinations thereof which are available, the address information in such 5 bits can be compressed into four bits as explained below. Thus, as shown in FIG. 3, the 5 bits R4, R3, C6, C5 and C4 assume one of 15 combinations as shown in the left-hand column thereof. Since only 15 combinations thereof are required in the identification of column and row for the cathode ray terminal such 15 different combinations can be adequately expressed by a 4 bit sub-word (which is capable of identifying up to 16 different combinations). Such a 4 bit sub-word is designated in FIG. 3 as having output bits 04, 03, 02, and 01. Thus, a correspondence between 15 combinations of 4 bits sub-word 04 - 01 can be made with respect to the 15 desired combinations of the 5 bit sub-word comprising R4, R3, C6, C5, C4 as shown. The conversion of such 5 bit combinations to the desired 4 bit combinations is performed by an appropriate bit compression device so that the 4 bit sub-word 04 - 01 is supplied to the 2K RAM 10 in FIG. 1. One embodiment of such a code compressor is shown in FIG. 2.

In the latter figure, a multiplexer device 14 which may be of the type, for example, sold under the designation Model No. SN74157, as manufactured by Texas Instruments, Inc., Dallas, Texas, may be utilized. As seen therein the most significant bit C6 of the column sub-word is supplied to the multiplexer select (SEL) input and to the B3, B4 inputs of such device. Bits C4, C5, R3 and R4 are supplied to the A1, A2, A3, A4 inputs, while the R3, R4 bits of the row sub-word are supplied to the B1, B2 inputs thereof. When the SEL input is low (a logical "0") the outputs assume the states of the A1 - A4 inputs, that is, 01 = A1, 02 = A2, 03 = A3, and 04 = A4. When the SEL input is high (a logical "1"), the outputs assume the states of the B1 - B4 inputs, that is, 01 = B1, 02 = B2, 03 = B3, and 04 = B4. Accordingly, the output bits 04 - 01 correspond to the 15 combinations of bits R4, R3, C6, C5, C4, in accordance with FIG. 3, i.e., each allowable state of the most significant bits of the column and row sub-words produces a unique state for the multiplexer outputs so that the multiplexer has compressed the five bit input combinations thereto into four bit output combinations.

Figure 4:
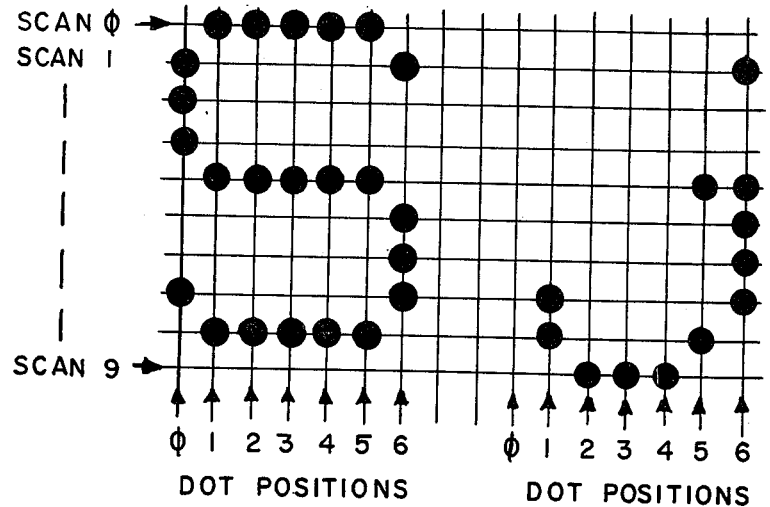
FIG. 4 shows a two-character display using dot matrix coding as a cathode ray tube display system in which an embodiment of the invention can be used.

In another video display context, the invention can prove advantageous for character displays as in a raster scan television monitor, for example, which uses a ROM character generator providing a dot matrix, the data being stored and communicated, for example, in accordance with the American Standard Code for Information Interchanges (ASCII code). Thus, the characters which are generated can each be displayed in a 7 × 10 dot matrix, as shown in FIG. 4 by the exemplary display of a two letter combination comprising the upper case letter "S" and the lower case letter "j" for purposes of illustration. With regard to the "S" character, the first sweep (identified as "scan $\phi$") produces output logic "1's" for dot positions 1, 2, 3, 4 and 5 and output logic "0's" for dot positions $\phi$ and 6. The second sweep (scan 1) produces output logic "1's" for dot positions $\phi$ and 6 and output logic "0'" for dot positions 1, 2, 3, 4 and 5, and so forth for each subsequent sweep. A similar summary of the logic outputs for the "j" character can also be determined. Thus, for displaying the required characters in accordance with the ASCII code, a character generator which can be in the form of a read-only-memory (ROM), for example, must have a storage capacity capable of storing 10 words of 7 bits for each character in the code set. For the ASCII code set of 96 characters (including letters, numbers and certain symbols) in such a dot matrix form, the character code requires 7 bits and the scan count requires 4 bits so that a total of 11 bits are normally used to address the ROM. For such an 11 bit address, a 2K ROM would be selected, i.e., a ROM having a 2048 word capacity, while a 1K ROM (i.e., a 1024 word capacity) would suffice for a 96 character ASCII code set (i.e., 96 codes × 10 scans, or 960 words). In such a 1K ROM, only 10 bits are necessary to address the ROM. It is desirable, therefore, to compress the normally required 11 bit address to a 10 bit address for use with a 1K ROM.

The displayed 96 character ASCII code set has 7 bits A6 through A$\phi$ and ranges in value from 0100000 to 1111111, while the scan count has bits S3 through S$\phi$ range in value from 0000 to 1001. Thus, the two most significant bits of the ASCII code have only three allowed states (01, 10 and 11) and the three most significant bits of the scan count have only five allowed states (000, 001, 010, 011 and 100). For each of these allowed states the remaining six less significant bits appear in all combinations. Thus, to address the ROM such less significant bits can be connected to the ROM directly while the five most significant bits can be compressed into 4 bits to provide a total 10 bit address input for the 1K ROM.

The chart of FIG. 5 shows the bit compression relationship wherein the two most signicant bits of ASCII code (identified as bits A6 and A5) and the three most significant bits of the scan count (identified as bits S3, S2 and S1) in the left-hand columns assume one of the fifteen combinations, each of which can be adequately expressed by a 4 bit sub-word as shown by the bits 04, 03, 02 and 01 in the right-hand columns.

Figure 6:
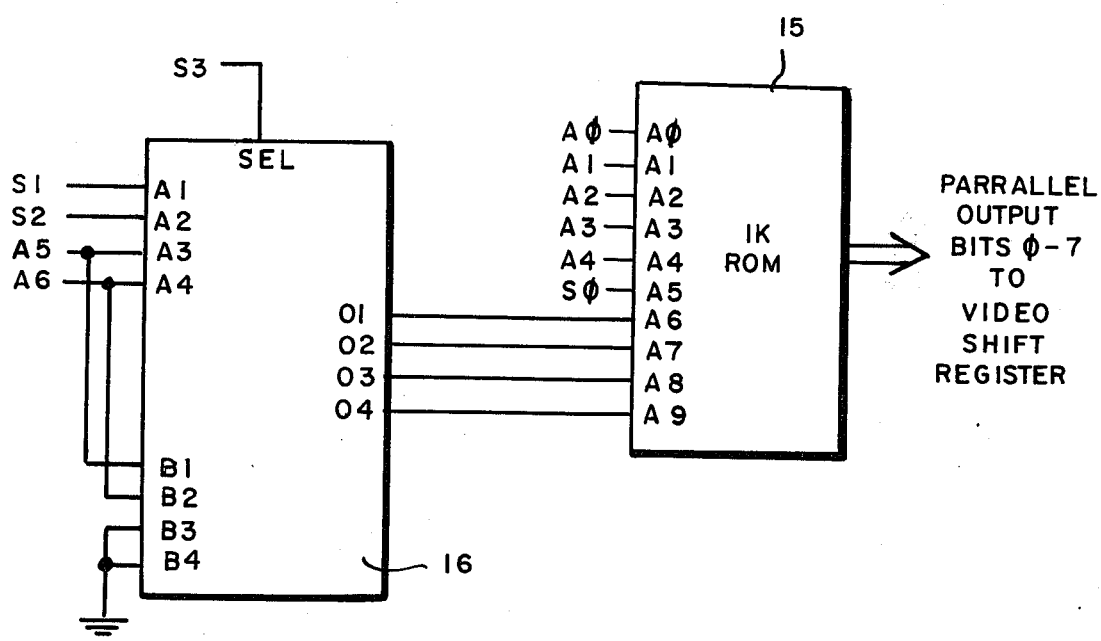
FIG. 6 shows a block diagram of an embodiment of the invention for use with such dot matrix code system.

The implementation of the compression of the 5 bit combinations to the 4 bit combinations depicted in FIG. 6, wherein bits A$\phi$ through A4 and bit S$\phi$ are supplied directly to the inputs A$\phi$ through A5 of ROM 15, while bits A5, A6, S1, S2 and S3 are supplied to a multiplexer device 16 of the same type discussed above in FIG. 2 to produce the output bits 01 through 04 for supply to the remaining inputs A6 –A9 of ROM 15. The 8 parallel output bits $\phi$ - 7 of the ROM are thereupon supplied to a conventional video shift register which in turn provides a serial bit output representing the desired video dot stream output signal for a cathode ray tube display in a manner well known to the art.

While the system of the invention has been described for use in a cathode ray tube display which uses a random access memory for refresh purposes or which uses read only memory character generators, the invention can be used in many other applications wherein a sufficient number of the allowable states of an input word are not required for use so that the total number of bits of such word can be compressed into a lesser number of bits which still provide the desired number of unique state combinations which are needed. Hence, the invention is not to be limited to the specific embodiment discussed herein except as defined by the appended claims.

What is claimed is:

1. A data bit compression system comprising
   means for providing a first binary signal having a first number of parallel bits; and
   bit compression means comprising a multiplexer responsive to a first selected group of parallel bits of said first binary signal, said first selected group being less than the total number of bits in said first binary signal and the number of bit combinations of said first selected group of bits which are required to define the information contained therein being less than the total number of said bit combinations thereof, said bit compressing means producing a second selected group of bits, the number of bits in said second selected group being less than the number of bits in said first selected group and the information in said second selected group corresponding to the complete information in said first selected group;
   said second selected group of bits, together with the remaining group of bits of said first binary signal not included in said first selected group, thereby providing a second binary signal having a second number of bits which is less than said first number of data bits and containing all of the information contained in said first binary signal.

2. A system in accordance with claim 1 wherein said first selected group of bits comprises selected ones of the most significant bits of said first binary signal.

3. A system in accordance with claim 1 wherein said first binary signal comprises a first binary sub-signal and a second binary sub-signal and said first selected group of bits comprises selected ones of the most significant bits of said first binary sub-signal and said second binary sub-signal.

4. A system in accordance with claim 1 wherein said second binary signal contains column and row information for use at a cathode ray display terminal wherein
   said first binary signal providing means comprises means for providing a column counter binary signal; and
means for providing a row counter binary signal;
said first selected group of bits comprising first selected ones of the most significant bits of said column counter signal and second selected ones of the most significant bits of said row counter signal, said bit compressing means producing said second selected group of bits having a number of bits which is less than the total number of said first and second selected ones of said most significant bits; and
random access memory means for storing character information and responsive to said secondary binary signal for supplying said stored character information to said cathode ray tube terminal.

5. A system in accordance with claim 4 wherein said column counter signal has 7 bits;
said row counter signal has 5 bits;
said first selected ones of said most significant bits comprise 3 bits;
said second selected ones of said most significant bits comprise 2 bits;
said second selected group of bits has 4 bits; and
said second binary signal has eleven bits.

6. A system in accordance with claim 1 for use in a dot-matrix character generating system in a cathode ray tube display device wherein said first binary signal providing means comprises
means for providing a scan sweep binary signal; and
means for providing a dot position binary signal;
said first selected group of bits comprising first selected ones of the most significant bits of said scan sweep signal and second selected ones of the most significant bits of said dot position signal, said bit compressing means producing said second selected group of bits having a number of bits which is less than the total number of said first and second selected ones of said most significant bits; and
read only memory means responsive to said second selected group of bits and to the remaining bits of said scan sweep binary signal and said dot position binary signal for supplying scan sweep and dot position signals for displaying dot matrix characters at said cathode ray tube.

7. A system in accordance with claim 6 wherein said scan sweep signal has 4 bits,
said dot position signal has 7 bits;
said first selected ones of said most significant bits comprise 2 bits;
said second selected ones of said most significant bits comprise 3 bits;
said second selected group of bits has 4 bits; and
said second binary signal has 10 bits.

* * * * *